United States Patent
Aoki

(10) Patent No.: US 8,542,552 B2
(45) Date of Patent: Sep. 24, 2013

(54) DLL CIRCUIT, FREQUENCY-MULTIPLICATION CIRCUIT, AND SEMICONDUCTOR MEMORY DEVICE

(75) Inventor: Akira Aoki, kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/420,866

(22) Filed: Mar. 15, 2012

(65) Prior Publication Data

US 2013/0077418 A1    Mar. 28, 2013

(30) Foreign Application Priority Data

Sep. 22, 2011   (JP) ................. 2011-208168

(51) Int. Cl.
   - G11C 8/18      (2006.01)
   - H03L 7/00      (2006.01)
   - H03B 19/00     (2006.01)

(52) U.S. Cl.
   USPC .............. 365/233.12; 365/194; 365/233.1; 327/113; 327/116; 327/119; 327/120; 327/122; 327/141; 327/146; 327/155; 327/160; 327/161

(58) Field of Classification Search
   USPC ............... 365/233.12, 233.1, 194; 327/113, 327/116, 119, 120, 122, 141, 46, 155, 160, 327/161
   See application file for complete search history.

(56) References Cited

U.S. PATENT DOCUMENTS

| | | | |
|---|---|---|---|
| 4,675,612 A * | 6/1987 | Adams et al. ............... | 327/142 |
| 5,786,715 A * | 7/1998 | Halepete ..................... | 327/116 |
| 6,087,864 A | 7/2000 | Aoki | |
| 6,628,154 B2 | 9/2003 | Fiscus | |
| 2003/0071665 A1 * | 4/2003 | Oyama ........................ | 327/116 |
| 2006/0114040 A1 * | 6/2006 | Sasaki ......................... | 327/161 |
| 2008/0048739 A1 * | 2/2008 | Nakaya et al. .............. | 327/146 |
| 2009/0085616 A1 * | 4/2009 | Wada et al. ................. | 327/117 |
| 2009/0189652 A1 * | 7/2009 | Kim et al. ................... | 327/116 |
| 2009/0238017 A1 * | 9/2009 | Wakasa ....................... | 365/194 |

FOREIGN PATENT DOCUMENTS

| | | |
|---|---|---|
| JP | 2001-257586 | 9/2001 |
| JP | 2003-60501 | 2/2003 |
| JP | 3487533 | 10/2003 |
| JP | 2006-33488 | 2/2006 |
| JP | 2006-287484 | 10/2006 |
| JP | 2009-118458 | 5/2009 |

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, there is provided a DLL circuit including a delay chain, a plurality of phase comparators, and a controller. The plurality of phase comparators receive the reference clocks individually and receive respectively the clocks from the delay elements in mutually different stages, among the delay elements of the plurality of stages. The controller simultaneously receives comparison results of the plurality of phase comparators, determines the number of stages that generate the clock of which a phase is synchronized with a phase of the reference clock from among the delay elements of the plurality of stages, and selects the number of output stages from among the delay elements of the plurality of stages based on the determined number of stages so that a delay clock having a demanded delay amount with respect to the reference clock is output.

20 Claims, 9 Drawing Sheets

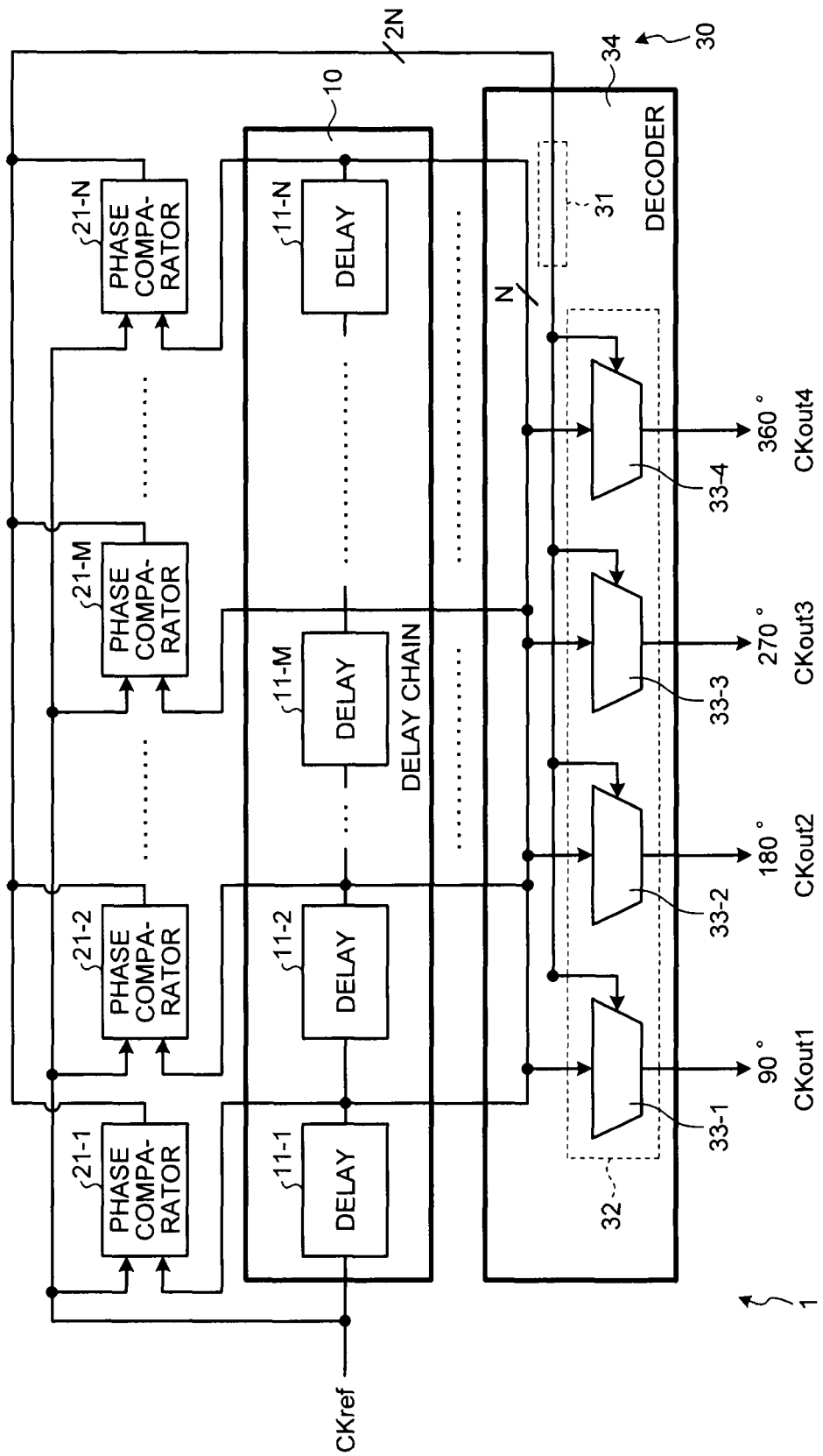

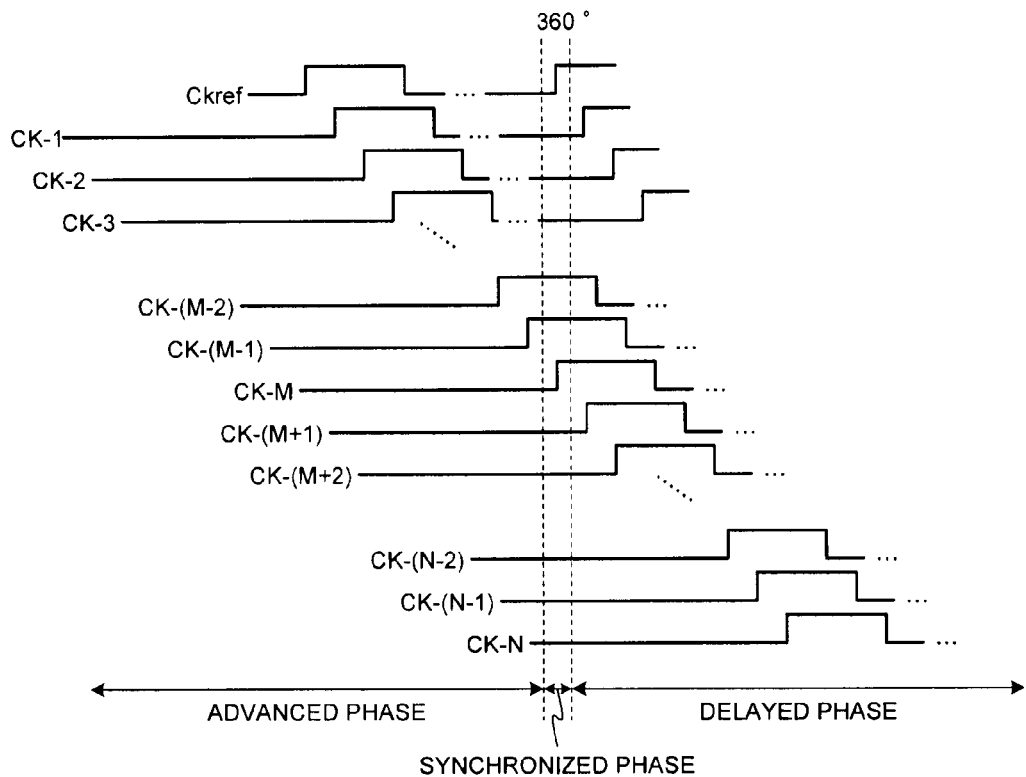

FIG.5

| PHASE COMPARISON RESULT | | | POINT AT WHICH ADJUSTMENT OF NUMBER OF DELAY STAGES IS INITIATED (FOR TOTAL NUMBER OF DELAY STAGES) |
|---|---|---|---|
| PHASE COMPARATOR 221-1(1/4) | PHASE COMPARATOR 221-2(2/4) | PHASE COMPARATOR 221-3(3/4) | |
| DELAY | DELAY | DELAY | 0/4+1 |
| ADVANCE / SYNCHRONIZATION | DELAY | DELAY | 1/4+1 |
| ADVANCE | ADVANCE / SYNCHRONIZATION | DELAY | 2/4+1 |
| ADVANCE | ADVANCE | ADVANCE / SYNCHRONIZATION | 3/4+1 |

US 8,542,552 B2

DLL CIRCUIT, FREQUENCY-MULTIPLICATION CIRCUIT, AND SEMICONDUCTOR MEMORY DEVICE

CROSS-REFERENCE TO RELATED APPLICATIONS

This application is based upon and claims the benefit of priority from Japanese Patent Application No. 2011-208168, filed on Sep. 22, 2011; the entire contents of which are incorporated herein by reference.

FIELD

Embodiments described herein relate generally to a DLL circuit, a frequency-multiplication circuit, and a semiconductor memory device.

BACKGROUND

Conventionally, there is a delay locked loop (DLL) circuit that synchronizes a phase of a delay clock and a phase of a reference clock by controlling the number of delay elements in a delay chain that is used to generate the delay clock from the reference clock.

BRIEF DESCRIPTION OF THE DRAWINGS

FIG. 1 is a diagram illustrating a configuration of a clock generating circuit (DLL circuit) according to a first embodiment;

FIG. 2 is a diagram illustrating an operation of the clock generating circuit according to the first embodiment;

FIG. 3 is a diagram illustrating an operation of the clock generating circuit according to the first embodiment;

FIG. 5 is a diagram illustrating an operation of the clock generating circuit according to the second embodiment;

DETAILED DESCRIPTION

Figure 4:
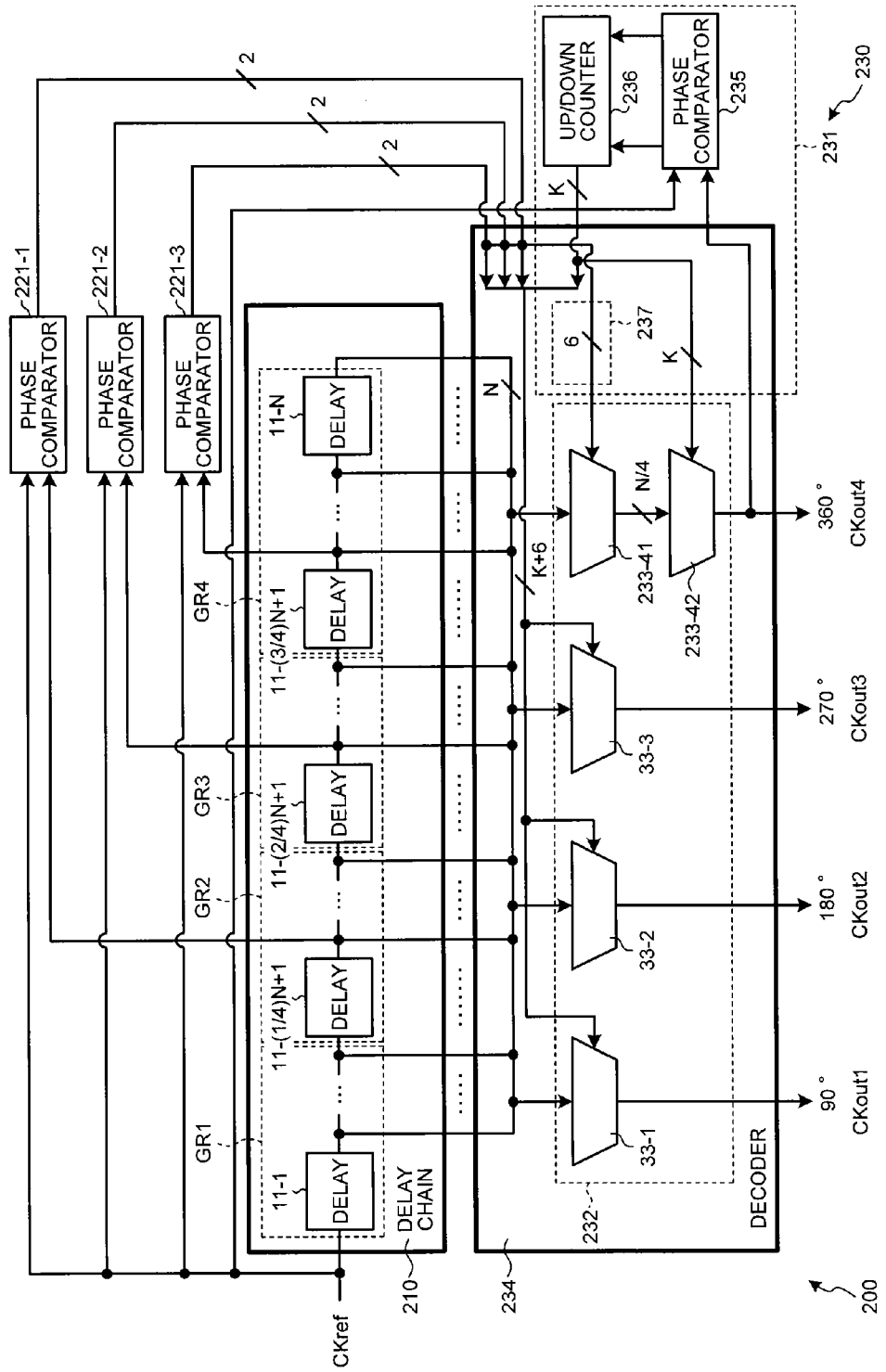
FIG. 4 is a diagram illustrating a configuration of a clock generating circuit (DLL circuit) according to a second embodiment.

In general, according to one embodiment, there is provided a DLL circuit including a delay chain, a plurality of phase comparators, and a controller. In the delay chain, delay elements are arranged into a plurality of stages numbered 1 to N (N a positive integer) connected in series and configured to generate delay clocks having mutually different delay amounts from each other with respect to a reference clock. The plurality of phase comparators receive the reference clock individually and receive respectively the clocks from the delay elements in mutually different stages, among the plurality of stages of the delay elements. The controller simultaneously receives comparison results from the plurality of phase comparators, determines the stage number that generates the clock of which a phase is synchronized with a phase of the reference clock from among the plurality of stages of the delay elements, and selects the stage from among the plurality of stages of the delay elements based on the determined stage number so that a delay clock having a demanded delay amount with respect to the reference clock is output. Exemplary embodiments of a DLL circuit, a frequency-multiplication circuit, and a semiconductor memory device will be explained below in detail with reference to the accompanying drawings. The present invention is not limited to the following embodiments.

(First Embodiment)

A clock generating circuit 1 according to a first embodiment will be described with reference to FIG. 1. FIG. 1 is a diagram illustrating a configuration of the clock generating circuit 1.

The clock generating circuit 1 receives a reference clock CKref from the outside, and outputs a clock having a predetermined phase relation with respect to the reference clock CKref. The clock generating circuit 1, for example, is a delay locked loop (DLL) circuit. That is, the clock generating circuit 1 delays the received reference clock CKref by demanded delay amounts, and outputs delay clocks CKout1, CKout2, CKout3, and CKout4 with the DLL locked. The DLL is locked in a state in which the delay amount (delay time) of the delay clock CKout4 to be output is an integer multiple (for example, one) of a cycle of the reference clock CKref. In other words, the DLL is locked in a state in which the phase of the delay clock CKout4 to be output is synchronized with the phase of the reference clock CKref (that is, in a state in which a phase difference between the delay clock CKout4 and the reference clock CKref falls within a predetermined range around zero so that it is considered that the phase of the delay clock substantially matches the phase of the reference clock CKref). A time until the DLL is locked will be referred to as a lock time.

Specifically, the clock generating circuit 1 includes a delay chain 10, a plurality of phase comparators 21-1 to 21-N, and a controller 30. A loop including the delay chain 10, the plurality of phase comparators 21-1 to 21-N, and the controller 30 forms a DLL.

In the delay chain 10, for example, delay elements 11-1 to 11-N of N stages (N is an integer of two or more) are connected in series. The delay elements 11-1 to 11-N of the N stages are even in delay characteristics (for example, a uniform predetermined delay amount D), and generates clocks having mutually different delay amounts with respect to the reference clock CKref.

For example, the delay element 11-1 of a first stage receives the reference clock CKref, delays the reference clock CKref by a predetermined delay amount D, and generates a clock CK-1. The delay element 11-1 of the first stage supplies the generated clock CK-1 to the delay element 11-2 of a second stage that is the next stage, and also supplies the clock CK-1 to both of a phase comparator 21-1 and a decoder 34. A clock CK-2 has the predetermined delay amount 2D with respect to the reference clock CKref.

For example, the delay element 11-2 of the second stage receives the clock CK-1 generated by the delay element 11-1 of the first stage that is the preceding stage, delays the clock CK-1 by the predetermined delay amount D, and generates the clock CK-2. The delay element 11-2 of the second stage supplies the generated clock CK-2 to the delay element 11-3 of a third stage (not illustrated) that is the next stage, and also supplies the clock CK-2 to both of a phase comparator 21-2 and the decoder 34. The clock CK-2 has two times the predetermined delay amount (2×D) with respect to the reference clock CKref.

For example, a delay element 11-M of an M-th stage (M<N, M is an integer of two or more) receives a clock CK-(M−1) generated by a delay element 11-(M−1) of an (M−1)-th stage that is the preceding stage (not illustrated), delays the clock CK-(M−1) by the predetermined delay amount D, and generates a clock CK-M. The delay element 11-M of the M-th stage supplies the generated clock CK-M to a delay element 11-(M+1) of an (M+1)-th stage which is the next stage (not illustrated), and also supplies the clock CK-M to both of the phase comparator 21-M and the decoder 34. The clock CK-M has M times the predetermined delay amount (M×D) with respect to the reference clock CKref.

For example, a delay element 11-N of an N-th stage receives a clock CK-(N−1) generated by a delay element 11-(N−1) of an (N−1)-th stage that is the preceding stage (not illustrated), delays the clock CK-(N−1) by the predetermined delay amount D, and generates a clock CK-N. The delay element 11-N of the N-th stage supplies the generated clock CK-N to both of a phase comparator 21-N and the decoder 34. The clock CK-N has N times the predetermined delay amount (N×D) with respect to the reference clock CKref.

Each of the plurality of phase comparators 21-1 to 21-N receives the reference clock CKref. Moreover, the plurality of phase comparators 21-1 to 21-N receive the clocks from the delay elements in different stages, among the delay elements 11-1 to 11-N of the N stages. Each of the plurality of phase comparators 21-1 to 21-N compares the clock generated by the delay element with the reference clock CKref, and outputs the comparison result to the decoder 34.

Specifically, the number of the plurality of phase comparators 21-1 to 21-N is N, that is, the same number as that of the delay elements, so that the plurality of phase comparators 21-1 to 21-N correspond to the delay elements 11-1 to 11-N of the N stages, respectively. The plurality of phase comparators 21-1 to 21-N receive the clocks from the delay elements 11-1 to 11-N in the corresponding stages among the delay elements of the N stages. Each of the phase comparators 21-1 to 21-N compares the clock generated by the corresponding delay element and the reference clock CKref, and outputs the comparison result to the decoder 34. For example, the comparison result may be represented by three values: "advance", "synchronization", and "delay"(see FIG. 3).

For example, the phase comparator 21-1 corresponds to the delay element 11-1 of the first stage, and receives the clock CK-1 generated by the delay element 11-1 of the first stage. Moreover, the phase comparator 21-1 receives the reference clock CKref. Then, the phase comparator 21-1 compares the phase of the reference clock CKref with the phase of the clock CK-1, and outputs the comparison result to the decoder 34. The phase comparator 21-1, for example, outputs "advance" representing that the phase of the clock CK-1 leads the phase of the reference clock CKref to the decoder 34 as the comparison result (see FIGS. 2 and 3).

For example, the phase comparator 21-2 corresponds to the delay element 11-2 of the second stage, and receives the clock CK-2 generated by the delay element 11-2 of the second stage. Moreover, the phase comparator 21-2 receives the reference clock CKref. Then, the phase comparator 21-2 compares the phase of the reference clock CKref with the phase of the clock CK-2, and outputs the comparison result to the decoder 34. The phase comparator 21-2, for example, outputs "advance" representing that the phase of the clock CK-2 leads the phase of the reference clock CKref to the decoder 34 as the comparison result (see FIGS. 2 and 3).

For example, the phase comparator 21-M corresponds to the delay element 11-M of the M-th stage, and receives the clock CK-M generated by the delay element 11-M of the M-th stage. Moreover, the phase comparator 21-M also receives the reference clock CKref. Then, the phase comparator 21-M compares the phase of the reference clock CKref with the phase of the clock CK-M, and outputs the comparison result to the decoder 34. The phase comparator 21-M, for example, outputs "synchronization" representing that the phase of the clock CK-M is synchronized with the phase of the reference clock CKref (that is, the phase difference between the clock CK-M and the reference clock CKref falls within a predetermined range around zero, so that the phase of the clock is considered to match the phase of the reference clock CKref) to the decoder 34 as the comparison result (see FIGS. 2 and 3).

For example, the phase comparator 21-N corresponds to the delay element 11-N of the N-th stage, and receives the clock CK-N generated by the delay element 11-N of the N-th stage. Moreover, the phase comparator 21-N receives the reference clock CKref. Then, the phase comparator 21-N compares the phase of the reference clock CKref with the phase of the clock CK-N, and outputs the comparison result to the decoder 34. For example, the phase comparator 21-N outputs "delay" representing that the phase of the clock CK-N lags behind the phase of the reference clock CKref to the decoder 34 as the comparison result (see FIGS. 2 and 3).

The controller 30 includes the decoder 34. The decoder 34 receives the comparison results of the respective plurality of phase comparators 21-1 to 21-N. The decoder 34 determines the stage number that generate the clock of which the phase is synchronized with the phase of the reference clock CKref in the delay elements 11-1 to 11-N of the N stages based on the comparison results of the plurality of phase comparators 21-1 to 21-N. Then, the decoder 34 selects the stage corresponding to the determined stage number in the delay elements of the N stages based on the determined number of stages. As a result, the decoder 34 outputs a delay clock having a demanded delay amount with respect to the reference clock CKref.

Specifically, the decoder 34 has a determining unit 31 and a selecting unit 32.

The determining unit 31 specifies the delay element corresponding to the phase comparator that supplies the comparison result representing that the phase of the clock is synchronized with the phase of the reference clock CKref. For instance, in the above example, the determining unit 31 specifies the delay element 11-M corresponding to the phase comparator 21-M that supplies the comparison result of "synchronization". As a result, the determining unit 31 determines M as the stage number that generates the clock of which the phase is synchronized with the phase of the reference clock CKref. In this way, the DLL including the delay chain 10, the plurality of phase comparators 21-1 to 21-N, and the decoder 34 comes to be in the lock state.

Specifically, the determining unit 31, for example, includes control signal lines having a signal width of 2N bits used to transfer the comparison results of the plurality of phase comparators 21-1 to 21-N to the selecting unit 32. At this time, in the signal transferred by the determining unit 31, as illustrated in FIG. 3, signals of a first bit, a second bit through a 2(M−1)-1-th bit, and a 2(M−1)-th bit represent the comparison result of "advance", signals of 2M−1-th bit and 2M-th bit represent the comparative example of "synchronization", and signals of a 2(M+1)-1-th bit, a 2(M+1)-th bit through a 2N−1-th bit, and a 2N-th bit represent the comparison result of "delay". That is, the determining unit 31 transfers the comparison results from the plurality of phase comparators 21-1 to 21-N to the selecting unit 32 as the determination representing the stage number M that generates the clock of which the phase is synchronized with the phase of the reference clock.

The selecting unit 32 receives the control signal of 2N bits that indicate the determined stage number (that is, the comparison results of the plurality of phase comparators 21-1 to 21-N) from the determining unit 31. The selecting unit 32 selects the stage of the N stages based on the determined stage number determined by the determining unit 31. For example, in the above example, the selecting unit 32 selects the stage among the N stages according to the determined stage number M that generates the clock of which the phase is synchronized with the phase of the reference clock CKref. The selecting unit 32 outputs the clock generated by the delay element of the selected number of output stages as a delay clock.

Specifically, the selecting unit 32 has a plurality of selectors which are respectively set in advance such that the clocks having demanded delay amounts can be selected. For example, when four clocks are demanded that are respectively delayed from the reference clock CKref in phase by 90°, 180°, 270°, and 360°, the selecting unit 32 has four selectors 33-1 to 33-4 corresponding to four phase differences.

For example, the selector 33-1 corresponds to a phase difference of 90°. The selector 33-1 receives the control signal of 2N bits that represent the determined stage number (for example, stage M) from the determining unit 31. Moreover, the delay elements of the N stages receive N clocks CK-1 to CK-N from the delay elements 11-1 to 11-N of the N stages through the clock signal lines having a signal width of the N bits. The selector 33-1 selects, according to the control signal, ¼ times the determined stage number (for example, M stages) (when the result of ¼ times the determined stage number is a fraction, the fraction is rounded off, rounded up or rounded down to produce an integer) (see FIG. 3), as the number of output stages. The selector 33-1 selects a certain number (¼×M) of clocks CK–(¼×M) where the certain number (¼× M) corresponds to ¼ times the determined stage number (M) from among N clocks CK-1 to CK-N, and outputs the clock as a delay clock CKout1.

For example, the selector 33-2 corresponds to a phase difference of 180°. The selector 33-2 receives the control signal of N bits, which represents the determined stage number (for example, M), from the determining unit 31. Moreover, the selector 33-2 receives N clocks CK-1 to CK-N from the delay elements 11-1 to 11-N of the N stages through the clock signal lines having a signal width of the N bits. The selector 33-2 selects a number corresponding to ½ times the determined stage number (where the number is obtained by rounding off, rounding up, or rounding down a fraction to produce an integer when ½ times the determined number is the fraction) as the stages according to the control signal (see FIG. 3). The selector 33-2 selects a certain number of clocks CK-(½×M) where the number corresponds to ½ times the selected number (M) of output stages from among the N clocks CK-1 to CK-N as a delay clock CKout2.

For example, the selector 33-3 corresponds to the phase difference of 270°. The selector 33-3 receives the control signal having N bits that represent the determined stage number (for example, M) from the determining unit 31. Moreover, the selector 33-3 receives the N clocks CK-1 to CK-N from the delay elements 11-1 to 11-N of N stages through the clock signal lines having a width of N bits. The selector 33-3 selects a certain stage number according to the control signal (see FIG. 3) where the certain stage number is ¾ times the determined stage number (for example, M) (where the number is obtained by rounding off, rounding up, or rounding down a fraction to product an integer when ¾ times the determined number is the fraction number). The selector 33-3 selects the clock CK-(¾×M) of the selected number (¾×M)of output stages from among the N clocks CK-1 to CK-N and outputs the selected clocks as a delay clock CKout3.

For example, the selector 33-4 corresponds to the phase difference of 360°. The selector 33-4 receives the control signal of N bits that represent the determined stage number (for example, M) from the determining unit 31. Moreover, the selector 33-4 receives the N clocks CK-1 to CK-N from the delay elements 11-1 to 11-N of the N stages through the clock signal lines having a signal width of the N bits. The selector 33-4 selects the stage number corresponding to the determined stage number (for example, M) as the stage according to the control signal (see FIG. 3). The selector 33-4 selects the clock CK-M of the selected number (M) of output stages from among the N clocks CK-1 to CK-N and outputs the selected clock as a delay clock CKout4.

Figure 10:
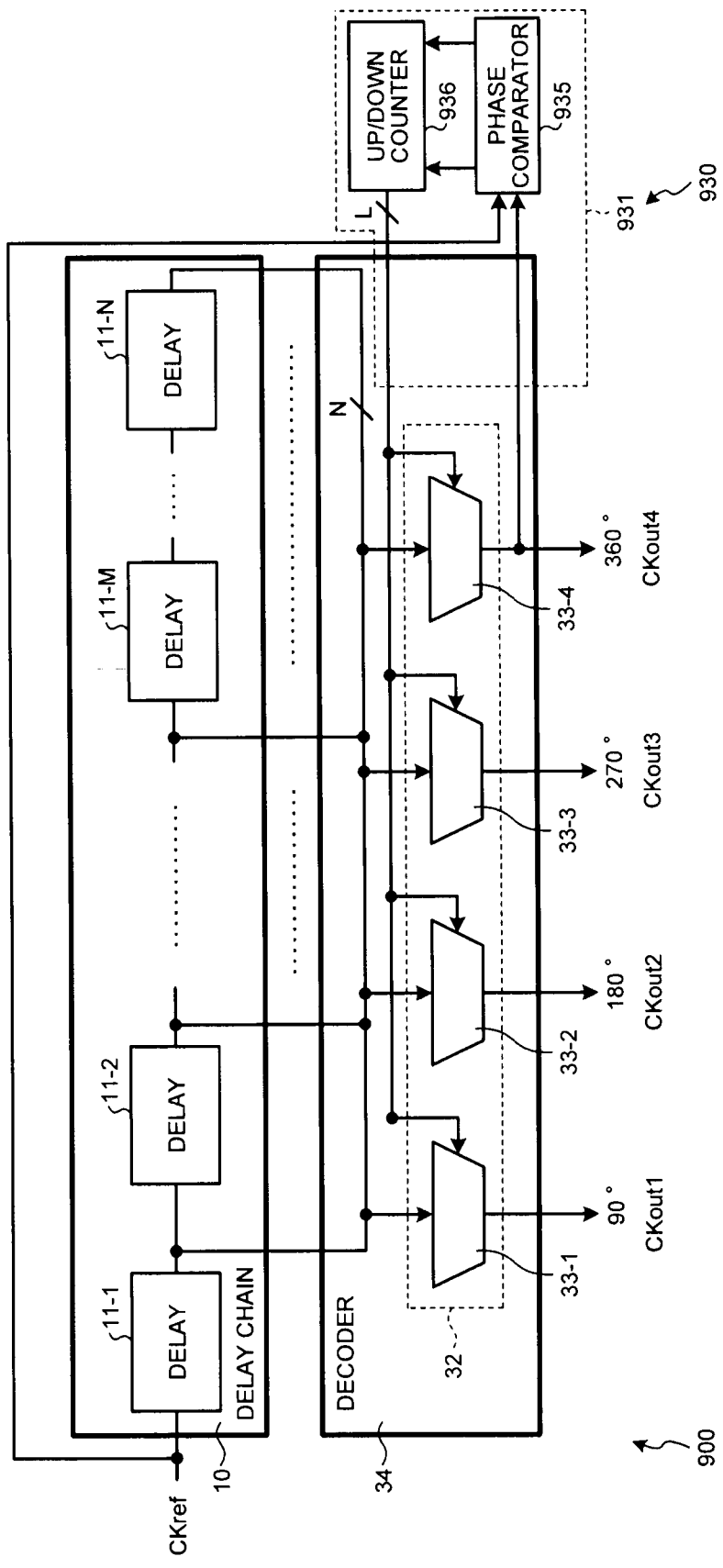
FIG. 10 is a diagram illustrating a configuration of a clock generating circuit (DLL circuit) according to a comparative example.

Here, as illustrated in FIG. 10, a case in which a clock generating circuit (DLL circuit) 900 does not include the plurality of phase comparators 21-1 to 21-N (see FIG. 1) is considered. In such a case, the clock generating circuit 900 counts up or counts down sequentially the stage number in the number of stages in the delay chain 10 that is selected according to the count value of an up/down counter 936, compares the phase of the clock generated by the delay element of the corresponding stage with the phase of the reference clock CKref every time counting-up or counting-down is conducted, and checks whether both are synchronized with each other. Therefore, a lock time taken for synchronizing the phase of the delay clock with the phase of the reference clock tends to increase.

For example, in the clock generating circuit 900, a determining unit 931 of a controller 930 includes control signal lines having a width of L (=$2^N$) bits, a phase comparator 935, and the up/down counter 936. For example, in an initial state, the up/down counter 936 supplies a count value "1" representing the delay element 11-1 of the first stage to each of the selectors 33-1 to 33-4 of the selecting unit 32 through the control signal lines. At this time, the selector 33-4 selects the clock CK-1 of the delay element 11-1 of the first stage and outputs the selected clock. The phase comparator 935 compares the clock CK-1 output from the selector 33-4 with the reference clocks CKref received from the outside. Then, the phase comparator 935, for example, supplies "advance" representing that the phase of the clock CK-1 leads the phase of the reference clock CKref to the up/down counter 936 as the comparison result (see FIG. 3). The up/down counter 936 increments the count value from "1" to "2" (actually representing two bits) representing the delay element 11-2 of the second stage according the comparison result of "advance". In this way, the up/down counter 936 increments the count value by 1, and for example, when the count value reaches "M" representing the delay element 11-M of the M-th stage, the phase comparator 935 supplies "synchronization" representing that the phase of the clock CK-M is synchronized with the phase of the reference clock CKref to the up/down counter 936 as the comparison result (see FIG. 3). The up/down counter 936 holds the last count value according to the comparison result "synchronization". As a result, the DLL configured by the loop including the delay chain 10, the phase comparator 935, the up/down counter 936, and the decoder 34 can enter the lock state. That is, as the lock time taken for synchronizing the phase of the delay clock with the phase of the reference clock CKref, a time which equals M times the clock period of the reference clock CKref is necessary.

On the other hand, in this embodiment (FIG. 1), the clock generating circuit (DLL circuit) 1 includes the plurality of phase comparators 21-1 to 21-N. The plurality of phase comparators 21-1 to 21-N receive the reference clock CKref individually and receive respectively the clocks from the delay elements 11-1 to 11-N in mutually different stages among the delay elements of the N stages. The controller 30 receives the comparison results in parallel from the plurality of phase comparators 21-1 to 21-N, and determines the stage number that generates the clock of which the phase is synchronized with the phase of the reference clock CKref from among the delay elements 11-1 to 11-N of the N stages. As a result, since it is possible to simultaneously check the clocks generated by the delay elements in different stages among the delay elements 11-1 to 11-N of the N stages for phase synchronization with the reference clock CKref, the lock time taken for synchronizing the phase of the delay clock with the phase of the reference clock compared to a comparative example in which clocks of all delay elements are sequentially checked one by one can be shortened.

Moreover, in the embodiment, the plurality of phase comparators 21-1 to 21-N receive the clocks from the delay elements in the corresponding stages among the delay elements 11-1 to 11-N of the N stages. As a result, since it is possible to simultaneously check the clocks generated by the delay elements in all stages among the delay elements 11-1 to 11-N of the N stages for phase synchronization with the reference clock CKref, the lock time necessary to synchronize the phase of the delay clock to the phase of the reference clock, for example, to an amount equal to a multiple (for example, 2 times) of the clock period of the reference clock CKref can be shortened.

For example, the plurality of phase comparators 21-1 to 21-N may supply two values of "advance" and "delay" as the comparison result. In this case, it is possible to reduce the signal width of the control signal lines used to transfer the comparison results of the plurality of phase comparator 21-1 to 21-N to the selecting unit 32 to the N bits.

(Second Embodiment)

Next, a clock generating circuit 200 according to a second embodiment will be described with reference to FIG. 4. FIG. 4 is a diagram illustrating a configuration of the clock generating circuit 200. Herein below, parts that are different from those of the first embodiment will be mainly described.

The clock generating circuit 200 includes a delay chain 210, a plurality of phase comparators 221-1 to 221-3, and a controller 230. The loop including the delay chain 210, the plurality of phase comparators 221-1 to 221-3, and the controller 230 forms a DLL.

In the delay chain 210, delay elements 11-1 to 11-N of N stages are divided into a plurality of groups. For example, the delay elements 11-1 to 11-N of the N stages are divided into four groups GR1 to GR4. Moreover, in the delay chain 210, the delay elements 11-1 to 11-N of the N stages are evenly divided into, for example, a plurality of groups so that each group includes an equal number of delay elements. For example, the delay elements 11-1 to 11-(¼)N of (¼)N stages from the first stage are included in group GR1, delay elements 11-((¼)N+1) to 11-(²⁄₄)N from a stage ((¼)N+1) to a stage (²⁄₄)N are included in group GR2, the delay elements 11-((²⁄₄)N+1) to 11-(¾)N from a stage ((²⁄₄)N+1) to a stage (¾)N are included in group GR3, and the delay elements 11-((¾)N+1) to 11-N starting from a stage ((¾)N+1) to a stage N are included in group GR4.

In each of the groups GR2 to GR4 except the first group GR1, the earliest stage of the delay elements 11-((¼)N+1), 11-((²⁄₄)N+1), and 11-((¾)N+1) supply clocks CK-((¼)N+1), CK-((²⁄₄)N+1), and CK-((¾)N+1) to the phase comparator 221-1 to 221-3, respectively.

The plurality of phase comparators 221-1 to 221-3 correspond to the groups GR2 to GR4, respectively. That is, there are a given number of phase comparators where the given number is less than the number of groups by one. The phase comparators correspond to the groups GR2 to GR4 except the first group GR1. The plurality of phase comparators 221-1 to 221-3, for example, receive the clocks from the delay elements 11-((¼)N+1), 11-((²⁄₄)N+1), and 11-((¾)N+1) which are the delay elements in the earliest stage in corresponding groups among the three groups GR2 to GR4. Moreover, each of the phase comparators 221-1 to 221-3 compares the clock generated from the corresponding group with the reference clock CKref, and outputs a comparison result to a decoder 234. The comparison result, for example, is represented by three values "advance", "synchronization", and "delay" (see FIG. 5).

The controller 230 includes a phase comparator 235 and an up/down counter 236 besides the decoder 234. That is, the controller 230 includes a selecting unit 232 and a determining unit 231, which includes the phase comparator (second phase comparator) 235, the up/down counter (sequentially selecting unit) 236 and the specifying unit 237. The selecting unit 232 includes selectors 233-41 and 233-42 into which the selector 33-4 is divided (see FIG. 1).

The specifying unit 237 specifies the group including the delay element that generates the clock of which the phase is synchronized with the phase of the reference clock CKref from among the plurality of groups GR1 to GR4, based on the comparison results of the plurality of phase comparators 221-1 to 221-3. Specifically, for example, the specifying unit 237 includes control signal lines having a signal width of six bits for transmission of the comparison results of the plurality of phase comparators 221-1 to 221-3 to the selecting unit 232. At this time, the signal transferred by the specifying unit 237, for example, is a signal representing the comparison result illustrated in FIG. 5. That is, the specifying unit 237 transfers the comparison results of the plurality of phase comparators 221-1 to 221-3 to the selector 233-41 as they are as control signals that represent specific contents of the group including the delay element that generates the clock of which the phase is synchronized with the phase of the reference clock CKref.

For example, when all of the comparison results of the plurality of phase comparators 221-1 to 221-3 are "delay", the group GR1 is specified as a group including the delay element that generates the clock of which the phase is synchronized with the phase of the reference clock CKref (see FIG. 5).

For example, when the comparison results of the plurality of phase comparators 221-1 to 221-3 are "synchronization", "delay", and "delay", respectively, the group GR2 is specified as a group including the delay element that generates the clock of which the phase is synchronized with the phase of the reference clock CKref (see FIG. 5).

For example, when the comparison results of the plurality of phase comparators 221-1 to 221-3 are "advance", "delay", and "delay" respectively, the group GR2 is specified as a group including the delay element that generates the clock of which the phase is synchronized with the phase of the reference clock CKref (see FIG. 5).

For example, when the comparison results of the plurality of phase comparators 221-1 to 221-3 are "advance", "synchronization", and "delay" respectively, the group GR3 is specified as a group including the delay element that generates the clock of which the phase is synchronized with the phase of the reference clock CKref (see FIG. 5).

For example, when the comparison results of the plurality of phase comparators 221-1 to 221-3 are "advance", "advance", and "delay" respectively, the group GR3 is specified as a group including the delay element that generates the clock of which the phase is synchronized with the phase of the reference clock CKref (see FIG. 5).

For example, when the comparison results of the plurality of phase comparators 221-1 to 221-3 are "advance", "advance", and "synchronization", respectively, the group GR4 is specified as a group including the delay element that generates the clock of which the phase is synchronized with the phase of the reference clock CKref (see FIG. 5).

For example, all of the comparison results from the plurality of phase comparators 221-1 to 221-3 are "advance", the group GR4 is specified as a group including the delay element that generates the clock of which the phase is synchronized with the phase of the reference clock CKref (see FIG. 5).

The selector 233-41 receives the control signal representing the specific contents of the group from the specifying unit 237. Moreover, the selector 233-41 receives N clocks CK-1 to CK-N from the delay elements 11-1 to 11-N of the N stages. The selector 233-41 selectively passes the clocks of the specified group among the N clocks CK-1 to CK-N according to the control signal representing the specific contents of the group and supplies the clocks of the specified group to the selector 233-42.

The up/down counter 236 sequentially selects the delay elements in the group specified by the specifying unit 237. In the initial stage, for example, the up/down counter 236 supplies the count value "1" representing the delay element of the first stage in the specified group to the selector 233-42 via the control signal lines (see FIG. 5). At this time, the selector 233-42 selects the clock of the delay element of the first stage in the specified group and outputs the selected clock.

The phase comparator 235 receives not only the reference clock CKref, but also the clock from the delay element selected by the up/down counter 236. That is, the phase comparator 235 compares the reference clock CKref received from the outside with the clock output from the selector 233-42. Moreover, the phase comparator 235, for example, supplies "advance" representing that the phase of the clock of the delay element of the first stage in the specified group leads the phase of the reference clock CKref to the up/down counter 236 as the comparison result (see FIG. 5).

The up/down counter 236 determines the stage number that generates the clock of which the phase is synchronized with the phase of the reference clock CKref, based on the comparison result of the phase comparator 235. For example, in the above example, the up/down counter 236 increments the count value from "1" to "2" (which is actually represented by two bits, for example) representing the delay element of the second stage in the specified group in accordance with the comparison result of "advance". In this way, the up/down counter 236 increments the count value by one. When the count value reaches a count value "J" representing the delay element of a J-th stage (J<(¼)N and J is an integer of two or more), the phase comparator 235 supplies "synchronization" representing that the phase of the clock of the delay element of the J stage matches the phase of the reference clock CKref, to the up/down counter 236 as the comparison result. The up/down counter 236 holds the last count value in accordance with the comparison result of "synchronization". In this way, the DLL configured by a loop including the delay chain 210, the phase comparator 235, and the up/down counter 236, and decoder 234 can be locked.

As described above, in the second embodiment, the specifying unit 237 specifies the group including the delay element that generates the clock of which the phase is synchronized with the phase of the reference clock CKref from among the plurality of groups GR1 to GR4, based on the comparison results of the plurality of phase comparators 221-1 to 221-3. The up/down counter 236 sequentially selects the delay elements in the group specified by the specifying unit237. The phase comparator 235 receives not only the reference clock CKref but also the clock from the delay element selected by the up/down counter 236, and compares both. The up/down counter 236 determines the stage number that generates the clock of which the phase is synchronized with the phase of the reference clock CKref, based on the comparison result of the phase comparator 235. Accordingly, since it is possible to simultaneously recognize which groups include the delay elements that generate the clocks of which the phases are synchronized with the phase of the reference clock CKref from among the plurality of groups GR1 to GR4, the number of stages of delay elements to be sequentially checked one by one can be significantly reduced. Accordingly, the lock time taken for synchronizing the phase of the delay clock with the phase of the reference clock can be shortened to about 1/(number of groups) (for example, to about ¼ in the case of FIG. 4) compared with the above-described comparative example (see FIG. 10) that sequentially checks the clocks of all the delay elements one by one.

Since the operation that sequentially checks the clocks of the delay elements one by one may not be performed when "synchronization" is included in the comparison results of the plurality of phase comparators 221-1 to 221-3, the lock time taken for synchronizing the phase of the delay clock with the phase of the reference clock can be shortened further.

Moreover, in the second embodiment, the number of the plurality of phase comparators 221-1 to 221-3 is significantly smaller than N; that is, it is smaller than the number of groups by one. Accordingly, the number of phase comparators used to determine the stage number that generates the clock of which the phase is synchronized with the phase of the reference clock CKref can be greatly decreased, which allows a reduction in the circuit size of the clock generating circuit 200.

Moreover, in the second embodiment, since the number of stages of the delay elements to be sequentially checked one by one can be greatly decreased, the number of bits that should be secured as the count value of the up/down counter 236 can be greatly decreased. For example, when the delay elements 11-1 to 11-N of the N stages are evenly grouped into a plurality of groups so that each group includes (¼)N delay elements, "$K=2^{(¼)N}$" is sufficient as the number of bits that should be secured as the count value. For this reason, the number of bits that should be secured as the count value in the second embodiment can be reduced compared to the number of bits ($L=2^N$) that should be secured as the count value in the comparative example in which all clocks of the delay elements are sequentially checked one by one. Even from this point of view, the circuit size of the clock generating circuit 200 can be decreased.

In the operation of sequentially checking the clocks of the delay elements one by one, the up/down counter 236 may perform a down-counting operation of counting down the count value "(¼)N" representing the delay element of the final stage in the specified group one by one. At this time, for example, when all of the comparison results of the plurality of phase comparators 221-1 to 221-3 are "synchronization", the up/down counter 236 may forcedly set the count value to "(¼)N" representing the delay element of the final stage in the specified group. In this case, since the operation that sequentially checks the clocks of the delay elements one by one may not be performed, the lock time taken for synchronizing the phase of the delay clock with the phase of the reference clock can be shortened further.

Figure 6:
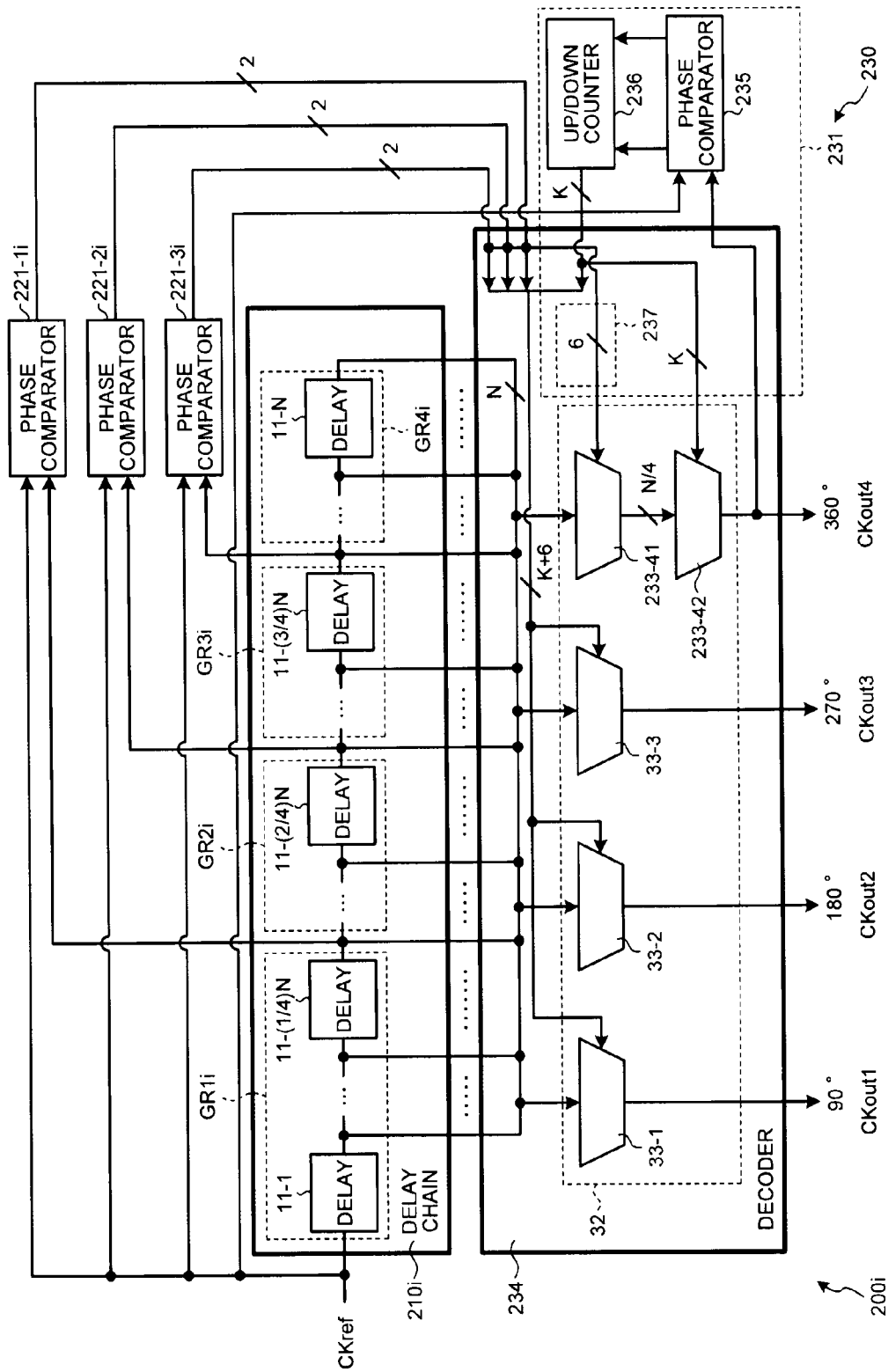
FIG. 6 is a diagram illustrating a configuration of a clock generating circuit (DLL circuit) according to a modification of the second embodiment.

Alternatively, in a clock generating circuit $200i$, as illustrated in FIG. 6, the delay element $11\text{-}(\tfrac{1}{4})N$, the delay element $11\text{-}(\tfrac{2}{4})N$, and the delay element $11\text{-}(\tfrac{3}{4})N$ of the final stage in each of the groups $GR1i$ to $GR3i$ except the final group $GR4i$ of a delay chain $210i$ may supply the clocks $CK\text{-}(\tfrac{1}{4})N$, $CK\text{-}(\tfrac{2}{4})N$, and $CK\text{-}(\tfrac{3}{4})N$ to the phase comparator $221\text{-}1i$ to $221\text{-}3i$, respectively. That is, the plurality of phase comparators $221\text{-}1i$ to $221\text{-}3i$ may correspond to groups $GR1i$ to $GR3i$ except the last group $GR4i$.

In this case, for example, when all of the comparison results of the plurality of phase comparators $221\text{-}1i$ to $221\text{-}3i$ are "delay", the group $GR1i$ is specified as a group including the delay element that generates the clock of which the phase is synchronized with the phase of the reference clock CKref.

For example, the comparison results of the plurality of phase comparators $221\text{-}1i$ to $221\text{-}3i$ are "synchronization", "delay", and "delay" respectively, the group $GR1i$ is specified as a group including the delay element that generates the clock of which the phase is synchronized with the phase of the reference clock CKref.

For example, when the comparison results of the plurality of phase comparators $221\text{-}1i$ to $221\text{-}3i$ are "advance", "delay", and "delay" respectively, the group $GR2i$ is specified as a group including the delay element that generates the clock of which the phase is synchronized with the phase of the reference clock CKref.

For example, when the comparison results of the plurality of phase comparators $221\text{-}1i$ to $221\text{-}3i$ are "advance", "synchronization", and "delay", respectively, the group $GR2i$ is specified as a group including the delay element that generates the clock of which the phase is synchronized with the phase of the reference clock CKref.

For example, when the comparison results of the plurality of phase comparators $221\text{-}1i$ to $221\text{-}3i$ are "advance", "advance", and "delay", respectively, the group $GR3i$ is specified as a group including the delay element that generates the clock of which the phase is synchronized with the phase of the reference clock CKref.

For example, when the comparison results of the plurality of phase comparators $221\text{-}1i$ to $221\text{-}3i$ are "advance", "advance", and "synchronization", respectively, the group $GR3i$ is specified as a group including the delay element that generates the clock of which the phase is synchronized with the phase of the reference clock CKref.

For example, when all of the comparison results of the plurality of phase comparators $221\text{-}1i$ to $221\text{-}3i$ are "advance", the group $GR4i$ is specified as a group including the delay element that generates the clock of which the phase is synchronized with the phase of the reference clock CKref.

Thus, even in the case of the clock generating circuit $200i$ illustrated in FIG. 6, it is possible to simultaneously check the plurality of groups $GR1i$ to $GR4i$ to know which group includes the delay element that generates the clock of which the phase is synchronized with the phase of the reference clock CKref from among the plurality of groups $GR1i$ to $GR4i$.

(Third Embodiment)

Figure 7:
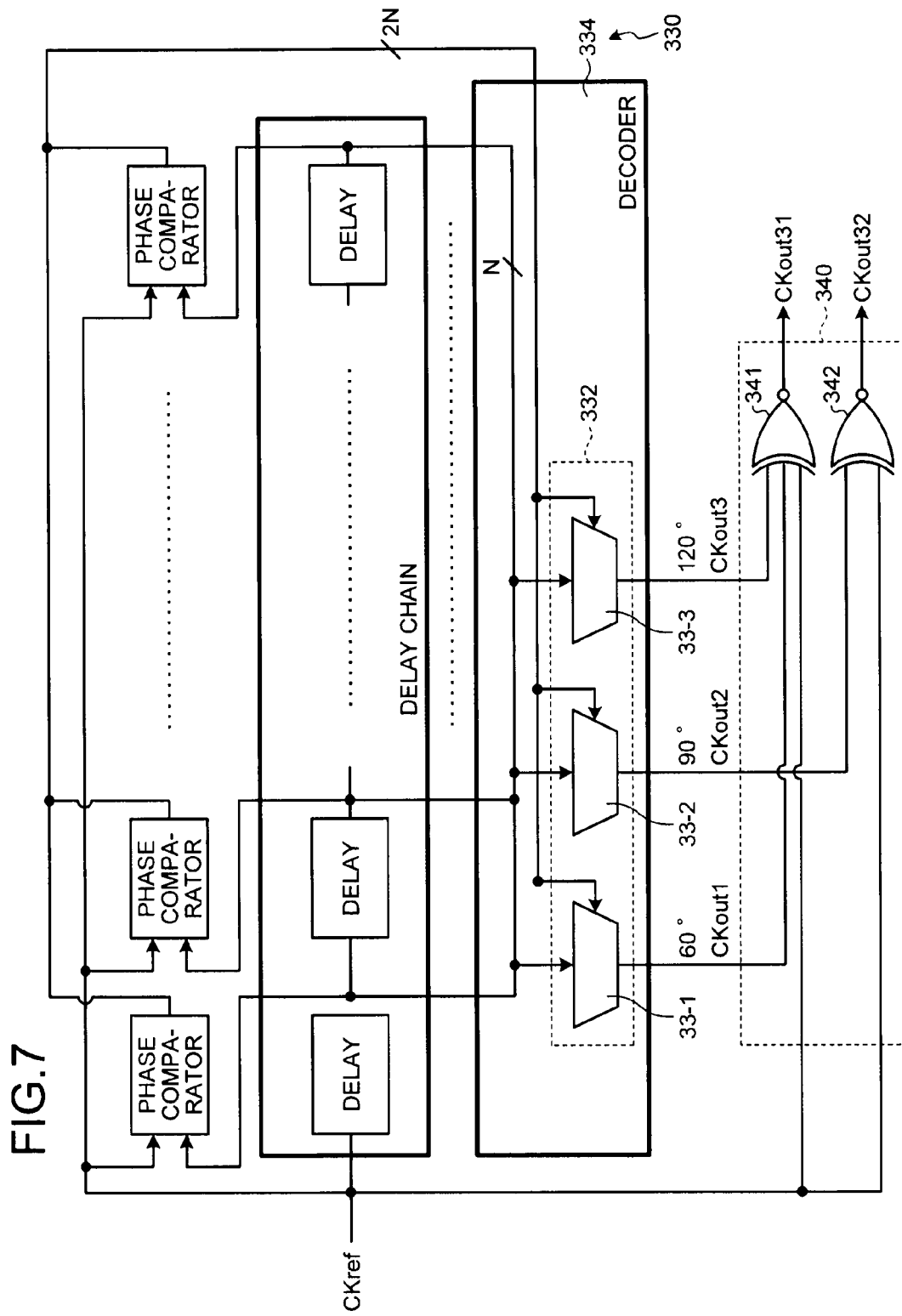
FIG. 7 is a diagram illustrating a configuration of a clock generating circuit (frequency-multiplication circuit) according to a third embodiment.

Next, a clock generating circuit 300 according to a third embodiment will be described with reference to FIG. 7. FIG. 7 is a diagram illustrating a configuration of the clock generating circuit 300. In the following description, parts different from those of the first embodiment will be mainly described.

The clock generating circuit 300 is a frequency-multiplication circuit based on the clock generating circuit 1 (DLL circuit) according to the first embodiment. That is, the clock generating circuit 300 includes a controller 330 and a generating unit 340. The controller 330 is different from the controller 30 of the first embodiment in that a selecting unit 332 does not include a selector 33-4.

The generating unit 340 receives not only a reference clock CKref, but also clocks from delay elements corresponding to the number of output stages selected by the controller 330, and generates and outputs multiplication clocks CKout31 and CKout32 obtained by multiplying the reference clock CKref. For example, the generating unit 340 includes exclusive-OR circuits 341 and 342.

The exclusive-OR circuit 341 receives the reference clock CKref from the outside, receives a clock CKout1 that has a phase difference of 60° with respect to the reference clock CKref from the selector 33-1, and receives a clock CKout3 that has a phase difference of 120° with respect to the reference clock CKref from the selector 33-3. The exclusive-OR circuit 341 performs an exclusive-OR operation of the reference clock CKref, the clock CKout1, and the clock CKout3, and outputs the operation result as a multiplication clock CKout31. The multiplication clock CKout31, for example, is a clock obtained by making the reference clock CKref tripled in frequency.

The exclusive-OR circuit 342 receives the reference clock CKref from the outside, and receives a clock CKout2 that has a phase difference of 90° with respect to the reference clock CKref from the selector 33-2. The exclusive-OR circuit 342 performs an exclusive-OR operation of the reference clock CKref and the clock CKout2, and outputs the operation result as a multiplication clock CKout32. The multiplication clock CKout32 is a clock obtained by making the reference clock CKref doubled in frequency.

In this way, in the third embodiment, since the frequency-multiplication circuit is configured based on the clock generating circuit 1 (DLL circuit) according to the first embodiment, when the multiplication clock which is a multiplied clock of the reference clock CKref is generated, the lock time taken for synchronizing the phase of the delay clock and the phase of the reference clock can be shortened.

(Fourth Embodiment)

Figure 8:
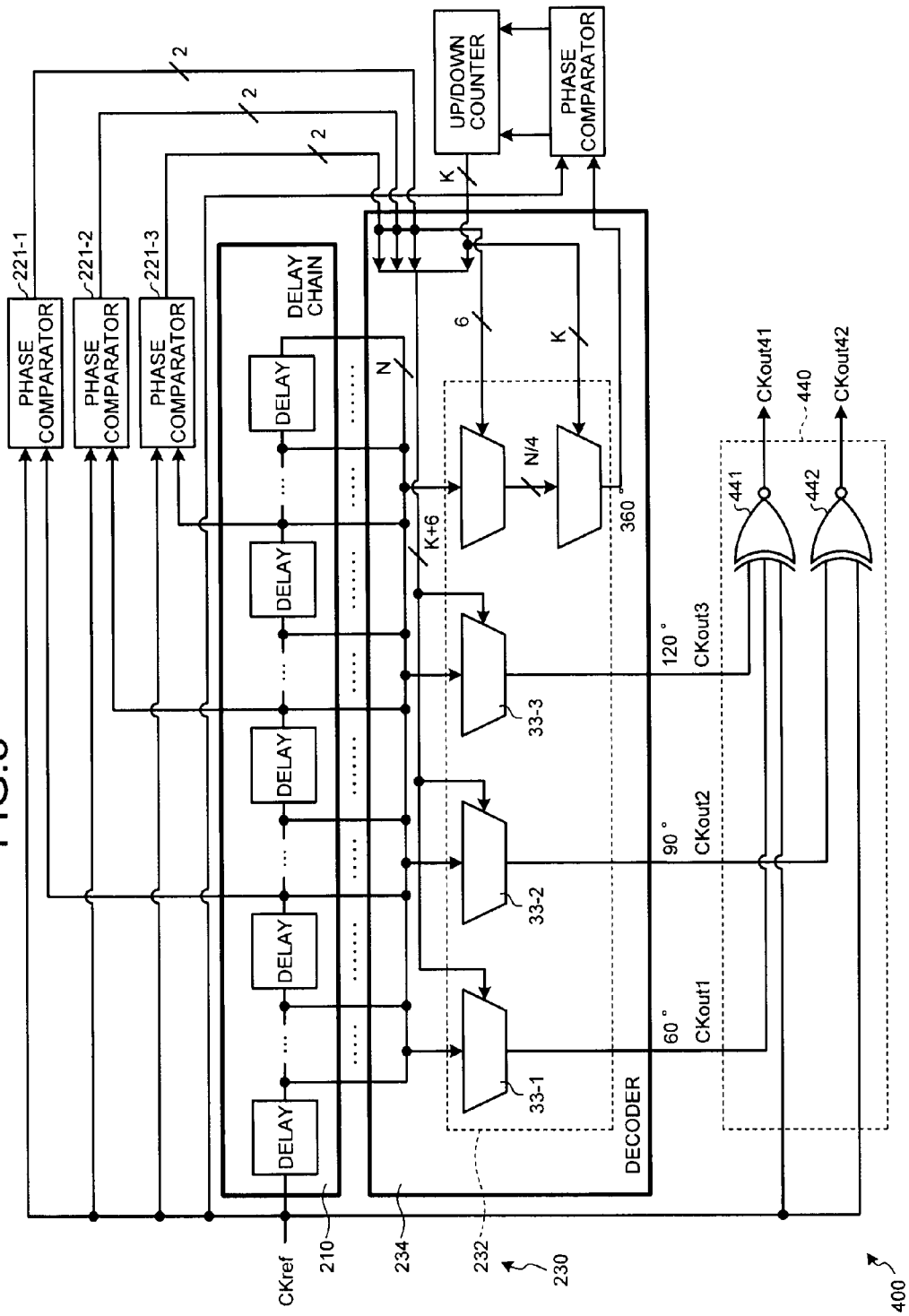
FIG. 8 is a diagram illustrating a configuration of a clock generating circuit (frequency-multiplication circuit) according to a fourth embodiment.

Next, a clock generating circuit 400 according to a fourth embodiment will be described with reference to FIG. 8. FIG. 8 is a diagram illustrating a configuration of the clock generating circuit 400. In the description below, parts different from those of the second embodiment will be mainly described.

The clock generating circuit 400 is a frequency-multiplication circuit based on the clock generating circuit 200 (DLL circuit) according to the second embodiment. That is, the clock generating circuit 400 includes a generating unit 440.

The generating unit 440 not only receives the reference clock CKref but also receives clocks from delay elements of which the number is equal to the number of output stages selected by a controller 230, and generates and outputs multiplication clocks CKout41 and CKout42 obtained by multiplying the reference circuit CKref. For example, the generating unit 440 has exclusive-OR circuits 441 and 442.

The exclusive-OR circuit 441 receives the reference clock CKref from the outside, receives the clock CKout1 that has a phase difference of 60° with respect to the reference clock CKref from the selector 33-1, and receives the clock CKout3 that has a phase difference of 120° with respect to the reference clock CKref from the selector 33-3. The exclusive-OR circuit 441 performs an exclusive-OR operation of the reference clock CKref, the clock CKout1, and the clock CKout3, and outputs the operation result as the multiplication clock CKout41. The multiplication clock CKout41, for example, is a clock by making the reference clock CKref tripled in frequency.

The exclusive-OR circuit 442 receives the reference clock CKref from the outside, and receives the clock CKout2 that has a phase difference of 90° with respect to the reference clock CKref from the selector 33-2. The exclusive-OR circuit 442 performs an exclusive-OR operation of the reference clock CKref and the clock CKout2, and outputs the operation result as the multiplication clock CKout42. The multiplication clock CKout42, for example, is a clock obtained by making the reference clock CKref doubled in frequency.

In this way, in the fourth embodiment, since the frequency-multiplication circuit is configured based on the clock generating circuit (DLL circuit) 200 according to the second embodiment, when the multiplication clock obtained by multiplying the reference clock CKref is generated, the lock time taken for synchronizing the phase of the delay clock with the phase of the reference clock can be shortened.

Next, a description will be made in connection with a configuration of a semiconductor memory device to which the clock generating circuit according to any one of the first to fourth embodiments is applied with reference to FIG. 9.

Figure 9:
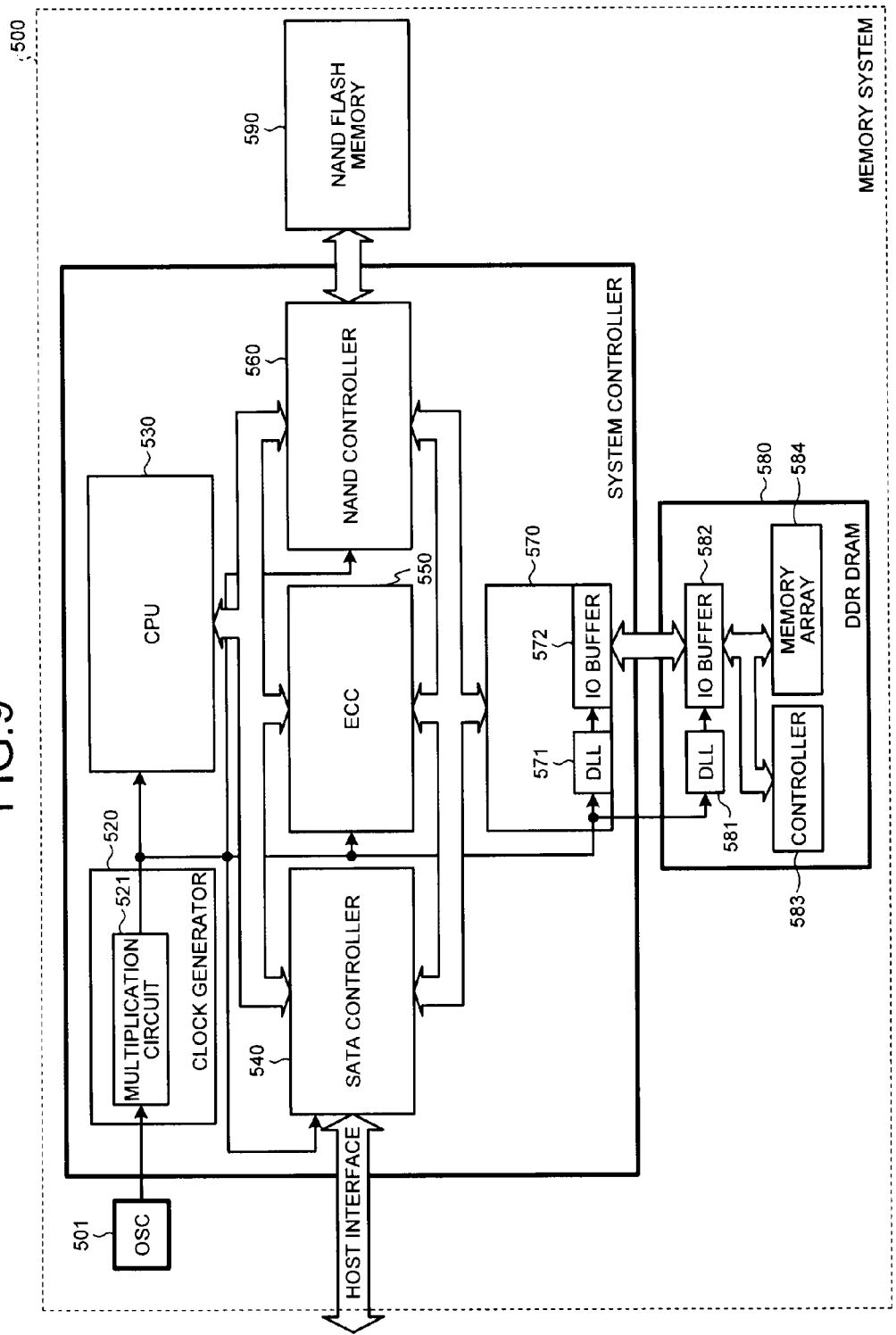
FIG. 9 is a diagram illustrating a configuration of a semiconductor memory device to which the clock generating circuits according to the first to fourth embodiments are applied.

A memory system 500 illustrated in FIG. 9, for example, functions as an external storage medium for a host device (not illustrated), and it may be a solid stage drive (SSD) or a memory card. The house device, for example, includes a personal computer or a CPU core. The memory system 500 includes an oscillation circuit 501, a system controller 510, and a memory device (for example, a DDR DRAM device) 580, and a memory device (for example, a NAND flash memory device) 590. The system controller (for example, an SSD controller) 510 includes a clock generator 520, a CPU 530, a SATA controller 540, an ECC module 550, a memory controller (for example, a NAND controller) 560, and a memory controller (for example, a DRAM controller) 570. The clock generator 520 includes a frequency-multiplication circuit 521. The memory controller 570 includes a DLL circuit 571 and an 10 buffer circuit 572. The memory device 580 has a DLL circuit 581, an 10 buffer circuit 582, a controller 583, and a memory array 584.

Here, the memory device 580 can be used as the semiconductor memory device, and the clock generating circuits 1 and 200 (DLL circuit) according to the first and second embodiments can be applied to the DLL circuit 581. At this time, the DLL circuit 581 uses the clock supplied from the clock generator 520 as the reference clock CKref and generates and outputs a delay clock by delaying the reference clock CKref. Moreover, the memory including the buffer circuit 582, the controller 583, and the memory array 584 can be operated by the delay clock output from the DLL circuit 581.

Alternatively, the memory system 500 is used as the semiconductor memory device, and the clock generating circuits 1 and 200 (DLL circuits) according to the first and second embodiments can be applied to the DLL circuit 571. At this time, the DLL circuit 571 uses the clock supplied by the clock generator 520 as the reference clock CKref, and generates and outputs a delay clock by delaying the reference clock CKref. Moreover, the memory including the memory device 580 can be operated by the delay clock output from the DLL circuit 581. In this way, for example, the memory controller 570 can read data from the memory device 580 at timing of a rising edge of the reference clock CKref and timing of a falling edge of the reference clock CKref, convert the read data from double data rate signals to single data rate signals of two systems, read each of the single data rate signals converted from the double data rate signal, and transmit back.

Alternatively, the memory system 500 is used as the semiconductor memory device, and the clock generating circuits 300 and 400 (frequency-multiplication circuits) according to the third and fourth embodiments can be applied to the frequency-multiplication circuit 521. At this time, the frequency-multiplication circuit 521 uses the clock supplied from the oscillation circuit 501 as the reference clock CKref, and generates and outputs a multiplication clock obtained by multiplying the reference clock CKref. Moreover, the memory including the memory device 580 can be operated by the multiplication clock output from the frequency-multiplication circuit 521. In this operation, the multiplication clock is used as the reference clock CKref to internally generate a delay clock, and the memory device 580 can be operated by the delay clock.

Moreover, the clock generating circuits according to the first to fourth embodiments can be applied to a system LSI for a television, or the like, besides the example illustrated in FIG. 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A DLL circuit comprising:
   a delay chain, in which delay elements are arranged into a plurality of stages numbered from 1 to N (N a positive integer) connected in series, that is configured to generate delay clocks having mutually different delay amounts from each other with respect to a reference clock;
   a plurality of phase comparators, each receiving the reference clock individually and each receiving respectively a clock from a corresponding stage of the delay elements, wherein the clocks received by the comparators from the delay elements are from mutually different stages among the plurality of stages of the delay elements; and
   a controller that simultaneously receives comparison results from the plurality of phase comparators, determines the stage number that generates the clock of which a phase is synchronized with a phase of the reference clock from among the plurality of stages of the delay elements, and selects a stage from among the plurality of stages of the delay elements based on the determined stage number so that a delay clock among said delay clocks having a demanded delay amount with respect to the reference clock is output.

2. The DLL circuit according to claim 1, wherein the delay elements have uniform delay characteristics with respect to each other and the stages also have uniform delay characteristics with respect to each other.

3. The DLL circuit according to claim 1,
   wherein each of the plurality of phase comparators receives the clock from a delay element of the corresponding stage, and
   wherein the controller determines the stage number that generates the clock of which the phase is synchronized with the phase of the reference clock, by specifying the delay element corresponding to the phase comparator that supplies the comparison result representing that the phase of the clock is synchronized with the phase of the reference clock.

4. The DLL circuit according to claim 3,
wherein the plurality of phase comparators simultaneously perform a comparison operation between each of the phases of the clocks generated by the plurality of stages of the delay elements and the phase of the reference clock.

5. The DLL circuit according to claim 1,
wherein each of the plurality of phase comparators receives the clock from a delay element of the corresponding stage among the the plurality of stages of the delay elements, and
wherein the controller determines the stage number that generate the clock of which the phase is synchronized with the phase of the reference clock by specifying a group of the delay elements that generates the clock of which the phase is synchronized with the phase of the reference clock based on the comparison results of the plurality of phase comparators.

6. The DLL circuit according to claim 5, wherein the plurality of phase comparators simultaneously perform a comparison operation between each of the phases of the clocks generated by the plurality of stages of the delay elements and the phase of the reference clock.

7. The DLL circuit according to claim 1,
wherein when the delay elements of the plurality of stages are divided into a plurality of groups, the plurality of phase comparators receive the clocks from the corresponding groups,
wherein the controller includes:
a specifying unit that specifies a group including the delay element that generates the clock of which the phase is synchronized with the phase of the reference clock from among the plurality of groups based on the comparison results of the plurality of phase comparators;
a sequentially selecting unit that sequentially selects the delay elements in the group specified by the specifying unit; and
a second phase comparator that receives the reference clock and receives the clock from the delay element selected by the sequentially selecting unit,
wherein the sequentially selecting unit determines the number of stages that generate the clocks that are synchronized with the reference clock in phase based on the comparison result of the second phase comparator.

8. The DLL circuit according to claim 7,
wherein the plurality of groups are obtained by dividing the delay elements of the plurality of stages in such a manner that each group includes an equal number of delay elements.

9. The DLL circuit according to claim 7,
wherein the number of the plurality of phase comparators is smaller than the number of the plurality of groups by one.

10. The DLL circuit according to claim 7,
wherein the plurality of phase comparators receive the clocks from the delay elements of the corresponding groups, and
wherein when the comparison results of the plurality of phase comparators include a comparison result representing synchronization, the sequentially selecting unit does not perform an operation of sequentially selecting the delay elements but determines the number of states that generate the clock of which the phase is synchronized with the phase of the reference clock, by specifying a representative delay element corresponding to the phase comparator that supplies the comparison result representing the synchronization.

11. The DLL circuit according to claim 10,
wherein representative delay elements of the plurality of groups are delay elements in corresponding stages in the groups.

12. The DLL circuit according to claim 10,
wherein when the comparison results of the plurality of phase comparators do not include a comparison result representing synchronization, the sequentially selecting unit sequentially selects the delay elements starting from the representative delay element in the group specified by the specifying unit.

13. A frequency-multiplication circuit, comprising:
a delay chain in which delay elements are connected in series having a plurality of stages numbered from 1 to N (N a positive integer) that generate delay clocks having mutually different delay amounts with respect to a reference clock;
a plurality of phase comparators that receives the reference clock, and receives clocks from delay elements that are in a different stage among the plurality of stages of the delay elements;
a controller that simultaneously receives comparison results from the plurality of phase comparators, determines the stage number that generates the clock of which a phase is synchronized with a phase of the reference clock from among the plurality of stages of the delay elements, and selects a stage from among the plurality of stages of the delay elements based on the determined stage number so that delay clocks among the said delay clocks, each having a demanded delay amount with respect to the reference clock, are output; and
a generating unit that receives the reference clock, receives the delay clocks output by the controller, and generates and outputs a multiplication clock obtained by multiplying the reference clock.

14. The frequency-multiplication circuit according to claim 13,
wherein each of the plurality of phase comparators receives a clock from a delay element of a corresponding stage among the plurality of stages of the delay elements,
wherein the controller determines the stage number that generates the clock of which the phase is synchronized with the phase of the reference clock, by specifying the delay element corresponding to the phase comparator that supplies the comparison result representing that the phase of the clock is synchronized with the phase of the reference clock.

15. The frequency-multiplication circuit according to claim 13,
wherein each of the plurality of phase comparators receives a clock from a delay element of a corresponding stage among the plurality of stages of the delay elements,
wherein the controller determines the stage number that generates the clock of which the phase is synchronized with the phase of the reference clock, by specifying the delay element that generates the clock of which the phase is synchronized with the phase of the reference clock based on the comparison results of the above-mentioned plurality of phase comparators.

16. The frequency-multiplication circuit according to claim 13, wherein when the delay elements of the plurality of stages are divided into a plurality of groups, the plurality of phase comparators receive the clocks from the corresponding groups, wherein the controller includes:

a specifying unit that specifies a group including the delay element that generates the clock of which the phase is synchronized with the phase of the reference clock from among the plurality of groups based on the comparison results of the plurality of phase comparators;

a sequentially selecting unit that sequentially selects the delay elements in the group specified by the specifying unit; and a second phase comparator that receives the reference clock and receives the clock from the delay element selected by the sequentially selecting unit;

and wherein the sequentially selecting unit determines the stage number that generates the clock of which the phase is synchronized with the phase of the reference clock, based on a comparison result of the second phase comparator.

17. A semiconductor memory device comprising:

a DLL circuit that delays a reference clock to generate a delay clock, and outputs the delay clock; and memory that operates by the output delay clock, wherein the DLL circuit includes:

a delay chain in which delay elements are connected in series having a plurality of stages numbered from 1 to N (N a positive integer) that generate delay clocks having mutually different delay amounts with respect to the reference clock;

a plurality of phase comparators, each receiving the reference clock individually and each receiving respectively a clock from a corresponding stage of the delay elements, wherein the clocks received by the comparators from the delay elements are from mutually different stages among the plurality of stages of the delay elements; and a controller that simultaneously receives comparison results from the plurality of phase comparators, determines the stage number that generates the clock of which a phase is synchronized with a phase of the reference clock from among the plurality of stages of the delay elements, and selects a stage from among the plurality of stages of the delay elements based on the determined stage number so that a delay clock among said delay clocks having a demanded delay amount with respect to the reference clock is output.

18. The semiconductor memory device according to claim 17, wherein each of the plurality of phase comparators receives a clock from a delay element of a corresponding stage among the plurality of stages of the delay elements, wherein the controller determines the stage number that generates the clock of which the phase is synchronized with the phase of the reference clock, by specifying the delay element corresponding to the phase comparator that supplies the comparison result representing that the phase of the clock is synchronized with the phase of the reference clock.

19. The semiconductor memory device according to claim 17, wherein each of the plurality of phase comparators receives a clock from a delay element of a corresponding stage among the plurality of stages of the delay elements, wherein the controller determines the stage number that generates the clock of which the phase is synchronized with the phase of the reference clock, by specifying the delay element that generates the clock of which the phase is synchronized with the phase of the reference clock based on the comparison results of the plurality of phase comparators.

20. The semiconductor memory according to claim 17, wherein when the delay elements of the plurality of stages are divided into a plurality of groups, the plurality of phase comparators receive the clocks from the corresponding groups, wherein the controller includes:

a specifying unit that specifies the group including the delay element that generates the clock of which the phase is synchronized with the phase of the reference clock among the plurality of groups based on the comparison results of the plurality of phase comparators;

a sequentially selecting unit that sequentially selects the delay elements in the group specified by the specifying unit one by one; and a second phase comparator that receives the reference clock and receives the clock from the delay element selected by the sequentially selecting unit;

and wherein the sequentially selecting unit determines the stage number that generates the clock of which the phase is synchronized with the phase of the reference clock based on a comparison result of the second phase comparator.

* * * * *